(12) United States Patent
Calvert

(10) Patent No.: US 8,106,736 B2
(45) Date of Patent: Jan. 31, 2012

(54) SOLENOIDAL MAGNETS HAVING SUPPORTED OUTER COILS

(75) Inventor: Simon James Calvert, Witney (GB)

(73) Assignee: Siemens PLC, Frimley, Camberley (GB)

( * ) Notice: Subject to any disclaimer, the term of this patent is extended or adjusted under 35 U.S.C. 154(b) by 0 days.

(21) Appl. No.: 13/115,336

(22) Filed: May 25, 2011

(65) Prior Publication Data

US 2011/0291782 A1 Dec. 1, 2011

(30) Foreign Application Priority Data

May 26, 2010 (GB) .................................. 1008746.8

(51) Int. Cl.
*H01F 5/00* (2006.01)
*H01F 6/00* (2006.01)
(52) U.S. Cl. ........................................ 335/299; 335/216
(58) Field of Classification Search .................. 335/216, 335/299, 301; 324/318–320; 505/705, 844, 505/872, 879, 892, 893; 62/51.1
See application file for complete search history.

(56) References Cited

U.S. PATENT DOCUMENTS

| | | | | |
|---|---|---|---|---|
| 4,595,899 A | * | 6/1986 | Smith et al. | 335/216 |
| 4,896,128 A | * | 1/1990 | Wollan et al. | 335/299 |
| 5,237,300 A | | 8/1993 | Ige et al. | |
| 5,668,516 A | * | 9/1997 | Xu et al. | 335/216 |
| 7,849,587 B2 | * | 12/2010 | Calvert et al. | 29/605 |

FOREIGN PATENT DOCUMENTS

| | | |
|---|---|---|
| EP | 0 350 262 A1 | 1/1990 |
| GB | 2 326 527 A | 12/1998 |
| GB | 2 384 314 A | 7/2003 |
| GB | 2 426 545 A | 11/2006 |
| GB | 2 437 114 B | 12/2008 |

* cited by examiner

*Primary Examiner* — Ramon Barrera

(74) *Attorney, Agent, or Firm* — Schiff Hardin LLP

(57) ABSTRACT

In a solenoidal electromagnet arrangement for a magnetic resonance imaging system, annular inner coils and annular end coils are provided, all concentrically aligned about an axis, the end coils being placed at axial extremities, axially outside of the inner coils. A pair of annular outer coils are provided concentrically aligned about the axis. An arrangement is provided retaining the pair of outer coils against an axial force urging the outer coils away from one another. The arrangement comprises strap elements which extend around a radially inner surface, a radially outer surface and an axially outer surface of each outer coil in certain circumferential locations. Each strap element on one of the outer coils is linked to a corresponding strap element on the other outer coil of the pair by a tensile member.

9 Claims, 3 Drawing Sheets

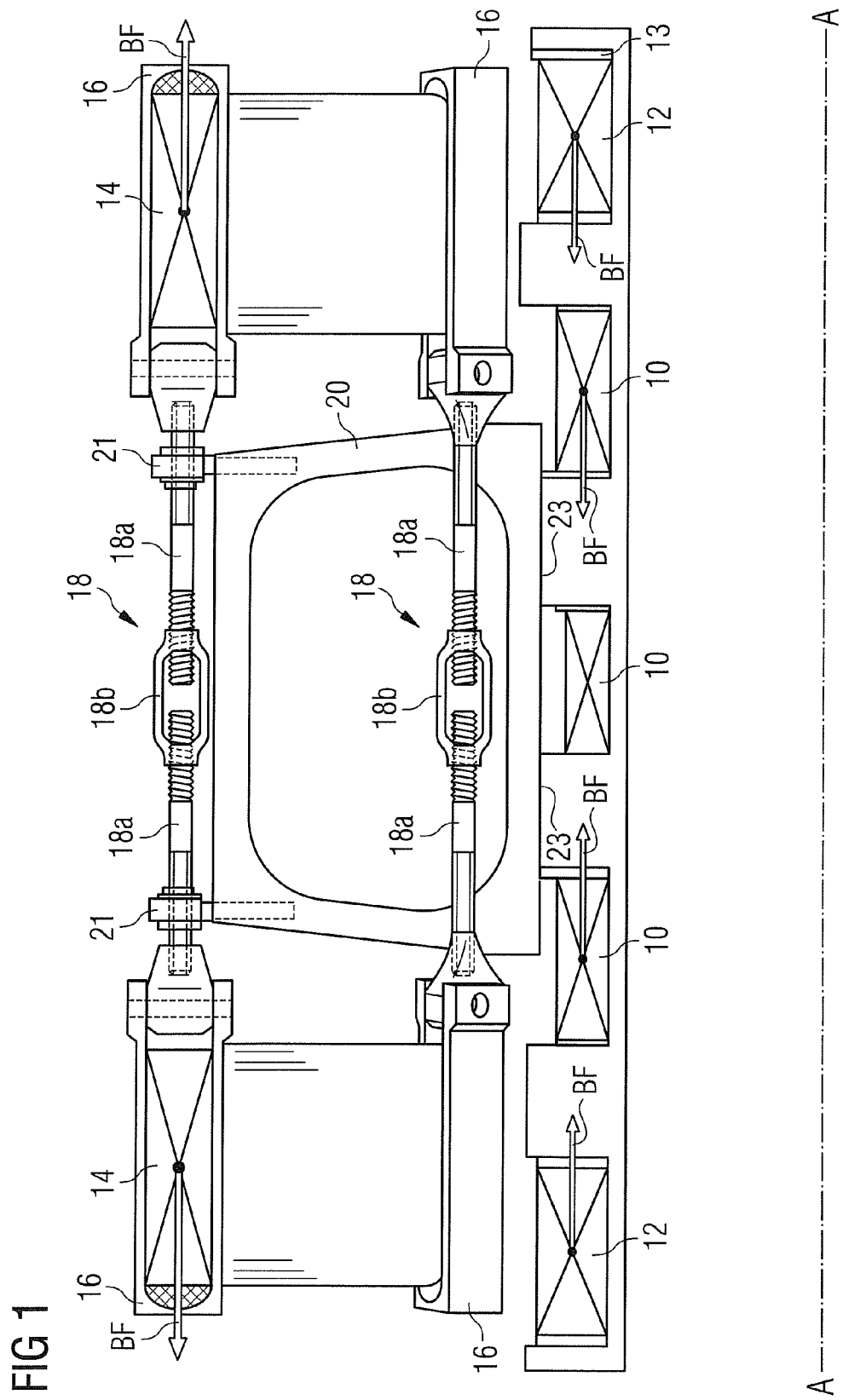

ized heating of the shield coils, which in superconducting magnets may lead to a quench.

SOLENOIDAL MAGNETS HAVING SUPPORTED OUTER COILS

BACKGROUND

The present preferred embodiments relate to methods for the production of solenoidal magnets having supported outer coils, and solenoidal magnets so produced.

The present preferred embodiments particularly relate to such solenoidal magnets for use as a magnetic field generator in a Magnetic Resonance Imaging (MRI) system. In particular, the preferred embodiments relate to such magnets formed of superconductive wire.

In known magnet arrangements, a solenoidal magnet typically comprises end coils of a relatively large number of turns, and hence cross-section and a number of inner coils of smaller number of turns and hence cross-section. Conventionally, an accurately machined former, such as a cylindrical aluminum former, is provided with appropriately shaped recesses into which wire is wound to form the coils. The coils may be impregnated with a thermosetting resin, either by wet-winding, in which a wire is passed through a bath of resin before being wound onto the former, or the coils may be wound dry, with the completed coils and former later being impregnated in a bath of resin.

Alternatively, arrangements of molded coils are known. In these arrangements, wound coils are placed into resin baths, and the finished coil impregnated with resin within the resin bath. The resin is then cured, and a solid coil embedded in resin is produced. These molded coils are then assembled into a magnet, for example by clamping onto a former or other mechanical support structure.

Actively-shielded magnets are also provided with shield coils, which are outer coils of greater diameter than the end coils and the inner coils of the solenoidal magnet. Such shield coils are typically wound into accurately-machined metal journals, and these journals are attached to the former using a number of webs spaced circumferentially around the journals.

These known arrangements suffer from certain drawbacks.

In use, the shield coils are subject to large forces, due to interaction of the coils with the magnetic fields produced. Some of these forces, for example the force known as the body force, act axially. The body force typically urges the shield coils away from a center of the magnet, although the body force may act to urge the shield coils towards the center of the magnet, and towards each other, depending on the design of the magnet. Other forces, for example the so-called hoop stress, act radially, tending to expand the coil to a larger diameter. The reaction force through the webs, required to oppose these axial and radial forces, puts strain onto the former, requiring the former and webs to be large and heavy to resist these forces. These forces may cause the shield coils to move relative to the journal. Such movement may cause local- The forces acting on the shield coils may cause the journal, or its support structure, to flex. Due to such flexure, the force reaction path resisting the forces on the coil then acts essentially at the radially inner edge of the shield coil, and the reaction forces are borne by a limited surface area of the coils. This may cause deformation of the coils themselves, which may also lead to quench in a superconducting coil. Conventionally, large and heavy support structures are provided to resist the forces acting on the outer coils.

An example arrangement for retention of shield coils is described in U.S. Pat. No. 5,237,300, incorporated herein by reference. In that document, the shield coils are said to be mounted within coil support cylinders.

An accurately-machined journal, together with its support structure, as conventionally used, is large, heavy, expensive, and is only available from a limited number of suppliers. Transport costs from the journal factory to the magnet winding facility may be significant. Storage of the large journal may be difficult and costly.

SUMMARY

It is an object to provide a new arrangement for the retention of shield coils in their intended relative positions.

In a solenoidal electromagnet arrangement for a magnetic resonance imaging system, annular inner coils and annular end coils are provided, all concentrically aligned about an axis, the end coils being placed at axial extremities, axially outside of the inner coils. A pair of annular outer coils are provided concentrically aligned about the axis. An arrangement is provided retaining the pair of outer coils against an axial force urging the outer coils away from one another. The arrangement comprises strap elements which extend around a radially inner surface, a radially outer surface and an axially outer surface of each outer coil in certain circumferential locations. Each strap element on one of the outer coils is linked to a corresponding strap element on the other outer coil of the pair by a tensile member.

The above, and further, objects, characteristics and advantages of the present preferred embodiments of the invention will become more apparent from consideration of the following description of these certain embodiments thereof, in conjunction with the appended drawings.

BRIEF DESCRIPTION OF THE DRAWINGS

FIG. 1 shows a part-axial sectional view of a coil assembly according to an embodiment of the present invention;

DESCRIPTION OF THE PREFERRED EMBODIMENTS

Figure 1A:
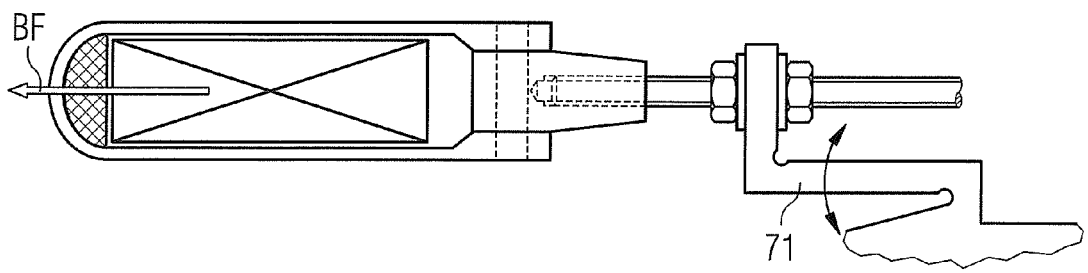
FIG. 1A shows flexible mounting pieces employed in an embodiment of the present invention.

For the purposes of promoting an understanding of the principles of the invention, reference will now be made to preferred embodiments/best mode illustrated in the drawings and specific language will be used to describe the same. It will nevertheless be understood that no limitation of the scope of the invention is thereby intended, and such alterations and further modifications in the illustrated method and such further applications of the principles of the invention as illustrated as would normally occur to one skilled in the art to which the invention relates are included.

According to the present preferred embodiments, pairs of outer coils such as shield coils are retained against the axial body force by strap elements which extend around each shield coil in the direction of the body force, in certain circumferential locations, each strap element being linked to a corresponding strap element on the other shield coil of the pair by a tensile member.

FIG. 1 shows a partial axial cross-section of an actively shielded magnet according to an embodiment of the present invention. The structure is essentially rotationally symmetrical about an axis parallel to line A-A. Within the present description, the terms 'axial' and 'axially' are used to denote a direction parallel to line A-A, while the terms 'radial' and 'radially' are used to denote a direction perpendicular to line A-A.

The solenoidal magnet includes inner coils 10 and end coils 12, of similar inner radii, joined together, for example on an aluminum former 13. In the illustrated example, the aluminum former 13 includes annular recesses into which the coils 10, 12 are wound. The coils may be impregnated, for example with epoxy resin, within these recesses. Arrows BF represent the direction of axial body forces acting on the various coils when the magnet is in use. The body forces on the inner coils 10 and end coils 12 act toward the center of the structure in this example.

The actively shielded magnet also includes shield coils 14. Arrows BF are also provided indicating the body force acting on the shield coils, when the magnet is in use. As shown in this example, the body force acts on the shield coils axially away from the center of the magnet. The shield coils 14 are of greater radius than the inner coils 10 and the end coils 12, and are held concentrically with the inner coils and the end coils by a retaining structure which is the subject of the present embodiments.

According to the present embodiments, each shield coil 14 is provided with a number of strap elements 16 in certain circumferential locations. Each strap element 16 is linked to a corresponding strap element 16 on the other shield coil of a pair by a tensile member 18. The strap elements and the tensile member are composed of strong, preferably non-magnetic and preferably lightweight materials. Example materials include aluminum, alloys primarily composed of aluminum, stainless steel and fiber reinforced composite materials. In the illustrated example, tensile rod components 18a are appropriately threaded at axially inner ends, and linked with a turnbuckle 18b. The turnbuckles allow adjustment of the length of each tensile member and so allow adjustments to the alignment of the shield coils 14.

The shield coils 14 are held concentric with the inner magnet structure comprising inner coils 10 and end coils 12 by support frames 20 and tensile members 18. Typically, and as illustrated in FIG. 1, some tensile members 18 are supported by a support frame 20, while others are not. A sufficient number of tensile members 18 must be provided to prevent the shield coils 14 from deforming due to the action of the axial body force in operation. This will vary according to the magnet, but twelve tensile members 18 evenly distributed around the circumference of the shield coils 14 may be found sufficient. The support frames 20 are required to mechanically retain the shield coils 14 in a fixed relative position as compared to the coils 10, 12 of the inner magnet structure. Three support frames 20, evenly distributed around the circumference of the shield coils 14 may be found sufficient.

Each support frame 20 may be mechanically linked to the corresponding tensile member 18 at or near the radially outer extremity of the support frame. In this way, the shield coils 14 are held concentric to the inner coils 10 and the end coils 12, and the body force BF acting on each shield coil 14 is counteracted by the body force BF acting on the other shield coil 14, through tension in the tensile members 18. The support frames 20 need not play any part in restraining the body force BF acting on the shield coils, but hold the shield coils 14 against gravity, and ensure coaxial alignment of the shield coils 14 with the inner magnet structure comprising inner coils 10 and end coils 12.

The support frames 20 are mechanically linked to corresponding tensile members 18, by any suitable arrangement, for example, using mounting pieces 21 as illustrated, which may be radially adjustable to ensure coaxial alignment of the shield coils 14 with the coils 10, 12 of the inner magnet structure. The tensile members 18 should be axially restrained to the support frames 20 to prevent any unwanted axial movement of the shield coils 14 relative to the support frames 20. The shield coils 14 are held in position relative to the inner magnet structure by this linking of support frames 20 to tensile members 18. The support frames 20 are preferably mechanically joined 23, at or near their radially inner extremity, to the support structure 13 of the inner coils 10 and/or the end coils 12. In the illustrated example, this may be a machined aluminum cylinder 13. However, the present embodiments may be applied in like manner to any coil support structure of the inner magnet structure. The position 23 of the join between the support frame 20 and the support structure 13 is preferably chosen to provide a required degree of radial compliance.

In an alternative embodiment, as shown in FIG. 1A, the rigid mounting pieces 21 of FIG. 1 may be replaced by flexible mounting pieces 71. If flexible mounting pieces are used, then all mounting pieces should be similar flexible mounting pieces to ensure that the outer shield coils remain concentric with the inner 10 and end 12 coils of the inner magnet structure. The flexible mounting pieces are formed of a strong material with an appropriate degree of flexibility, resilience and mechanical strength. Aluminum, stainless steel and certain fiber-reinforced resin composite materials may be found suitable. The flexible mounting pieces are each able to expand and contract radially, as shown in phantom on the drawing, while maintaining sufficient mechanical strength to retain the shield coils in position. As the magnet assembly is cooled, different radial thermal contraction distances of the shield coils as compared to the support structure 13 of the coils 10, 12 of the solenoidal magnet may mean that the radial separation between the shield coils 14 and the support structure 13 is different when the magnet is cold as compared to when the magnet is at ambient temperature. This difference in radial separations is accommodated by flexure of the flexible mounting pieces 71. Similarly, in use, hoop stresses in the shield coils 14 may cause them to expand or contract. Such expansion or contraction may mean that the radial separation between the shield coils 14 and the support structure 13 is different when the magnet is in use as compared to when the magnet is not in use. This difference in radial separations is accommodated by flexure of the flexible mounting piece 71. In embodiments without flexible mounting pieces 71, the variation in radial separations is accommodated by flexure of the tensile members 18.

Figure 2:
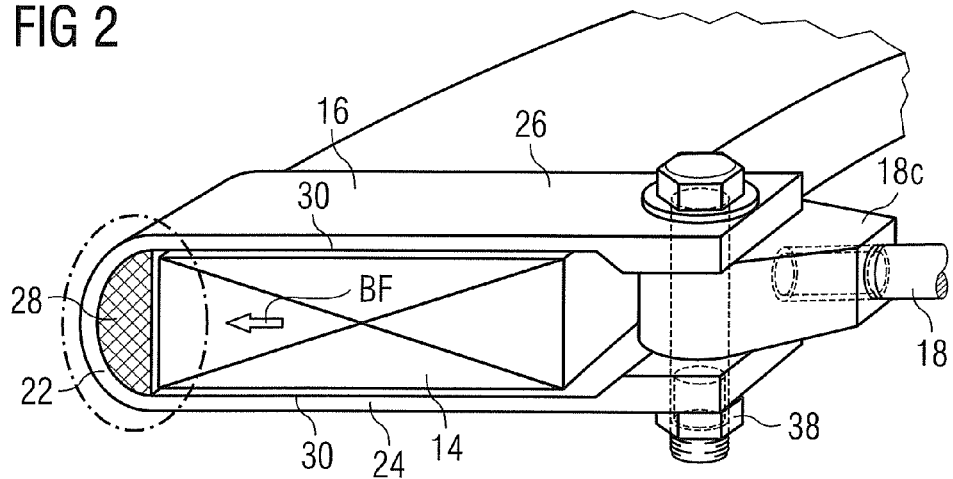
FIG. 2 shows a part-axial cross-section of a shield coil, and part of a shield coil retaining apparatus according to an embodiment of the present invention.

FIG. 2 shows a strap element 16 linked to a shield coil 14 in more detail. The shield coil 14 is an impregnated coil. It is a solid block of hardened material, such as epoxy resin, which contains numerous turns of wire. In preferred embodiments of the present invention, superconducting wire is used for all coils. However, the present invention embodiments may also be applied to resistive magnets, in which non-superconductive (resistive) wire is used, or to magnets in which some coils are superconductive, and some are resistive.

The strap element 16 extends around radially inner, axially outer and radially outer surfaces of the shield coil 14. As illustrated, it may also extend at least partly around the axially inner surface of the coil. To avoid deformation of the strap element, and the creation of point of high pressure between the strap element and the shield coil, the strap element preferably has a rounded axially outer end 22, linking radially inner 24 and radially outer 26 arms. The rounded outer end ensures a more even distribution of stress in the material of the strap element, and a more even pressure on the axially outer surface of the coil, as compared to a rectangular end. A filler material 28 is preferably provided in such arrangements, to evenly distribute pressure from the strap element 16 over the enclosed axially outer surface of the shield coil 14. Preferably, the filler material 28 is firmly bonded to the adjacent surfaces of the coil 14 and the strap element 16. Preferably, slip plane material 30, such as glass fiber-filled PTFE tape, is placed between the arms 24, 26 of the strap element and the adjacent surfaces of the coil 14. The slip plane material 30 will prevent the coil 14 from bonding to the strap element 16 in those positions. This is advantageous because axial thermal contraction (or expansion) of the strap element 16 is likely to be different from that of the coil 14, so that relative movement is possible between the adjacent surfaces of the coil and the arms of the strap element, preventing thermally-induced stress from building up. In the case of a superconducting coil, such build up of stress may suddenly be released in an abrupt movement of the coil, which may lead to a quench. Superconducting magnets are cooled to cryogenic temperatures, and it is this cooling which might otherwise lead to a build-up of thermal stress. Resistive magnets, on the other hand, will heat up when in use, and it is this heating which might otherwise lead to a build-up of thermal stress, although the problem of quench will not arise.

Figure 3:
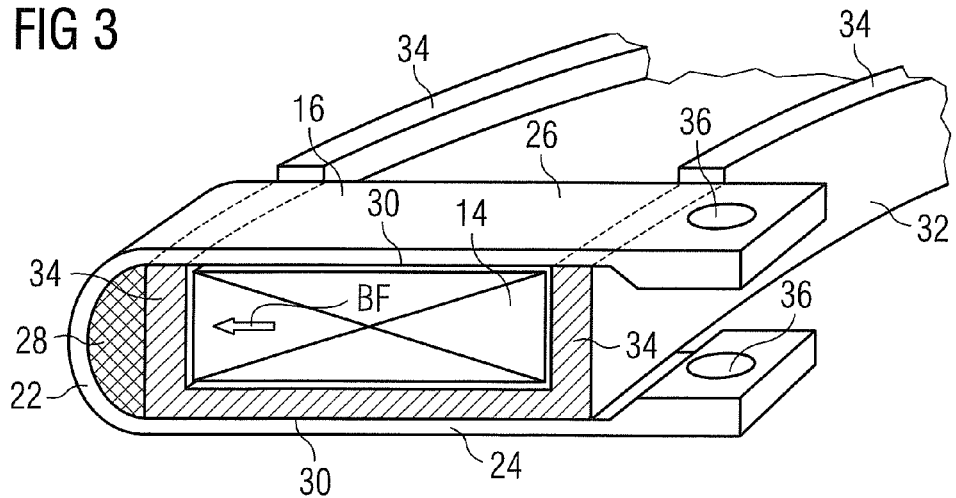
FIG. 3 shows a part-axial cross-section of a shield coil, and part of a shield coil retaining apparatus according to another embodiment of the present invention.

FIG. 3 shows another alternative embodiment of the present invention. In this embodiment, the shield coil 14 is wound into a journal 32. The coils and the journal may be bonded together, for example by the hardened material used for impregnation of the coil. This may be achieved by wet-winding the coil into the journal, or by dry-winding the coil into the journal, and impregnating the coil and journal together. Alternatively, release layers of conventional type may be provided between the coil and the journal surfaces, enabling the coil to move somewhat relative to the journal. To facilitate winding of the coil, the journal may have walls 34 which extend radially beyond the radially outer surface of the shield coil 14. As shown in the drawing, the walls may be shortened in the region of the strap element 16, to allow the radially outer arm 26 to securely retain the radially outer surface of the coil. Slip plane material 30 may be placed between the arms 24, 26 of the strap element and the journal-and-coil assembly.

As best seen in FIG. 3, axially inner extremities of the arms 24, 26 of the strap element 16 may be provided with through-holes 36. These holes, or an equivalent structure, are used to attach tensile member 18 to the strap element 16. As shown in FIG. 2, a nut and bolt 38 or equivalent arrangement such as a clevis pin may be passed through the holes 36 and through an eye of a tensile member 18. Tensile member 18 may include a rod of non-magnetic material, such as aluminum, stainless steel, bronze or fiber composite materials. Those tensile members 18 attached to support frames 20 must be rigid, to provide the required mechanical support. However, for tensile members which are not attached to support frames 20, the tensile member may comprise a braid, cable or chain, preferably of non-magnetic materials. Solid rods are presently preferred, however, since they are believed to reduce the scope for relative movement of the shield coils as compared to the inner magnet structure. The illustrated eye 18c of the tensile member may be replaced by a shackle (not illustrated), joining the outside surfaces of the arms of the strap element.

Impregnated filler material 28 may be used to fill a gap between the axially outer wall 34 of journal 32 and the axially outer part 22 of strap 16. Alternatively, other means may be used for bracing axially outer wall 34 against axially outer part 22 of strap 16. For example, a threaded hole may be provided through axially outer part 22 of strap 16, and a bolt screwed through this hole to bear upon axially outer wall 34. This may provide further adjustment of the axial position, and the alignment, of the outer coil.

Preferably, and as illustrated in FIG. 2, the structural strength of the resin-impregnated coil itself is used to support the coil in position. The strap elements 16 provide intermittent support and retention around the circumference of the coil, but the coil is unsupported between the strap elements.

In certain embodiments of the present invention, the support strap may be placed around a pre-fabricated resin-impregnated coil. However, in a preferred embodiment, the support strap is bonded to a dry-wound coil in a resin impregnation step. This is preferably arranged by placing the support straps over the wound coils in the mould before the coil is impregnated.

Figure 4A:
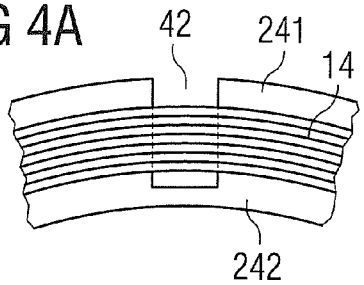
FIG. 4A shows a partial radial sectional view of the apparatus of FIG. 4, when viewed in direction V.
Figure 4:
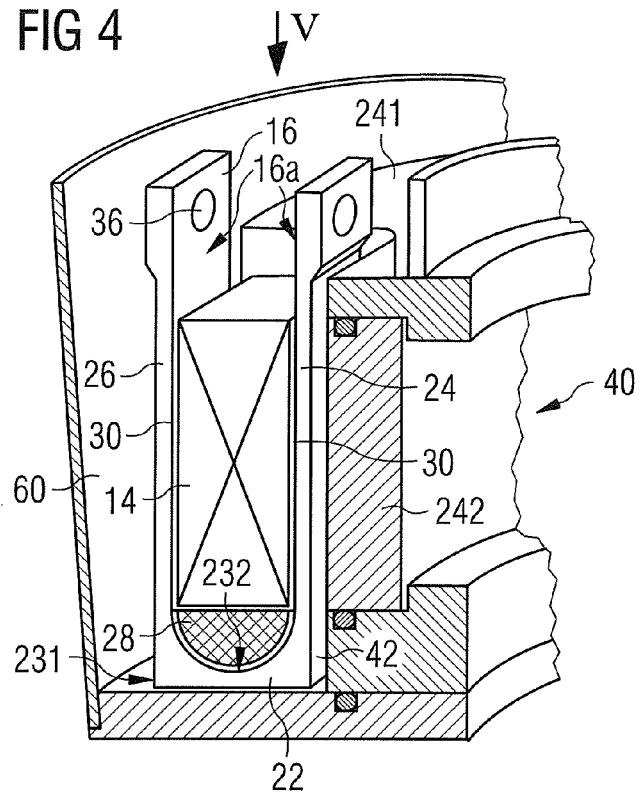
FIG. 4 shows a part-axial cross-section of a shield coil, and part of a shield coil retaining apparatus at a certain stage during manufacture according to an embodiment of the present invention.

FIG. 4 shows a step during such a manufacturing process. As may be observed in the drawing, the arms 24, 26 of the strap element 16 preferably have a constant separation, unlike the arms of the strap element of FIGS. 2 and 3, which partially enclose the axially inner face of the respective coil.

If required, and as illustrated in FIG. 4, the strap element arms may be thickened on their free ends, without reducing the separation between them.

In the embodiment of FIG. 4, the axially outer end 22 of the strap element 16 may have a squared outer surface 231, to assist with assembly and retention within the mould, and a rounded inner surface 232, for the reasons discussed with reference to FIGS. 2 and 3.

Figure 5:
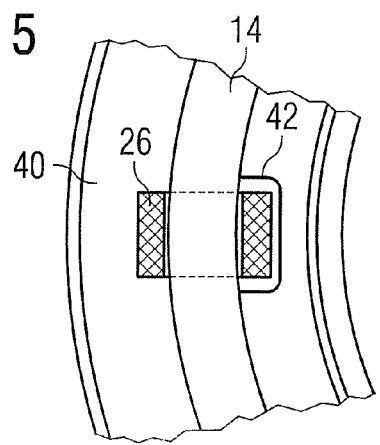
FIG. 5 shows a partial plan view of the apparatus of FIG. 4, when viewed in direction V.

FIG. 4 shows a part radial cross section through a mould 40 into which a coil is placed, while FIG. 5 shows a corresponding partial plane view. A journal surface 242 and corresponding walls 241 form a journal into which the coil 14 has been wound. As illustrated in FIG. 4A, the walls 241 and journal 242 are provided with dedicated recesses 42 which provide access for the strap elements 16 and filler material 28 to be placed over the coil 14 within the mould 40. During assembly, the walls 241 and journal surface 242 are assembled and optionally surface treated in the conventional manner.

Coil winding is performed conventionally, to provide the coil, as shown in FIG. 4. The strap elements 16 are prepared as required, for example by positioning filler material 28 and slip plane material 30 as appropriate within the strap element. The strap elements are then inserted into the dedicated recesses 42 within the journal walls 241 and the journal surface 242 and are retained by an adhesive, or mechanically such as by an interference fit. Tooling pieces are added to complete the mould, and provide an impregnation trough 60 as illustrated. The mould 40 is flooded with resin, as is conventional. This resin is typically applied under vacuum, and penetrates into the coil 14, between the turns of the wire, and into the filler material 28. The resin is cured, the coil cleaned and the resultant structure has many turns of wire embedded within resin, with support straps 16 bonded to the coil.

The shield coil so produced is then assembled to the remainder of the magnet as illustrated in FIGS. 1, 2. The resulting structure is lightweight, is strong in tension, and does not cause bending of the coils, as the force reaction path through the strap element and tensile member 18 is aligned with the body force BF.

Alternatively, an impregnated shield coil 14 may be produced as conventionally, with strap elements 16 placed around the coil later. The filler material 28, if present, may be impregnated separately before assembly to the coil, or a second impregnation step may be performed, to impregnate the filler material 28 and bond it to the coil.

The components of the outer coil retention arrangement of the present invention are inexpensive and simple to manufacture. They could be manufactured by hundreds of engineering businesses around the world, reducing the cost of the outer coil supports far below that of conventional outer coil support arrangements. The strap elements 16 may be formed by simple extrusion, sawing and drilling. A milling operation may be used to ensure correct dimensions of the strap elements. They may be formed of anodized aluminum for effective bonding to resin. Alternatively, non-anodized aluminum, aluminum alloy, or other suitably strong and preferably non-magnetic materials such as a composite fiber-reinforced resin may be used. The tensile elements 18 may be formed of simple rods, and stainless steel, brass or aluminum clevis pins or nuts and bolts 38 are easily sourced.

Support frames 20 may be cast in metal, molded in a composite material, cut or stamped from sheet material. The support frames are preferably essentially planar, and so are inexpensive and simple to manufacture, transport and store.

The support frames may be attached to the support structure 13 of the inner coils 10 and/or the end coils 12, for example the illustrated aluminum former 13, by common hardware elements such as nuts and bolts, although these are preferably of non-magnetic material.

The present preferred embodiments accordingly provide an arrangement for supporting shield coils which is reduced in cost, and weight; which is easier to store and source; and which does not cause bending of the shield coils. It is also believed that the shield coils will be retained, according to the present invention preferred embodiments, in a more definite and repeatable position than was conventionally the case.

The shield coils retained according to the present invention preferred embodiments are readily accessible for cooling by partial immersion in liquid cryogen. Similarly, coil surfaces are readily accessible for cooling by a cooling loop arrangement.

The most unstable part of a superconducting shield coil is the radially inner surface. In conventional arrangements, that surface is adjacent to the journal and not readily accessible for cooling. In preferred embodiments of the present invention, the radially inner surface of the shield coil is readily accessible, and may be more effectively cooled than in conventional arrangements. In conventional arrangements, this most unstable part is also in contact with a supporting journal, whereby a risk of relative motion of coil over journal leads to a likelihood of quench.

The alignment of the outer coils 14 may be easily adjusted by the tensile rods 18 and mounting pieces 21 of certain embodiments of the present invention. This enables improvements to be made to the homogeneity of the resulting magnetic field, and/or to the effectiveness of the stray field shielding provided by the outer, (shield) coils.

According to the present invention preferred embodiments, the body force on one of a pair of outer (shield) coils is reacted against a body force acting on the other of the pair of outer (shield) coils. Hoop stresses are contained by the structural integrity of the coil itself. No mechanical loads are transferred from the outer (shield) coils to the supporting structure of the cylindrical magnet, contrary to the prior art. This enables a lighter support structure to be provided.

Although preferred exemplary embodiments and other embodiments are shown and described in detail in the drawings and in the preceding specification, they should be viewed as purely exemplary and not as limiting the invention. It is noted that only preferred exemplary embodiments and other embodiments are shown and described, and all variations and modifications that presently or in the future lie within the protective scope of the invention should be protected.

I claim as my invention:

1. A solenoidal electromagnet arrangement for a magnetic resonance imaging system, comprising:
    annular inner coils and annular end coils, all concentrically aligned about an axis, the end coils being placed at axial extremities, axially outside of the inner coils;
    a pair of annular outer coils concentrically aligned about the axis; and
    an arrangement retaining the pair of outer coils against an axial force urging the outer coils away from one another, said arrangement comprising strap elements which extend around a radially inner surface, a radially outer surface and an axially outer surface of each outer coil in certain circumferential locations, each strap element on one of the outer coils being linked to a corresponding strap element on the other outer coil of the pair by a tensile member.

2. An arrangement according to claim 1 wherein the outer coils are held concentric with said inner coils and end coils by support frames which are mechanically joined to a support structure of the inner coils and/or the end coils and mechanically joined to the tensile members.

3. An arrangement according to claim 2 wherein a length of the tensile members is adjustable.

4. An arrangement according to claim 2 wherein support frames are mechanically linked to the corresponding tensile members at or near radially outer extremities of the support frames.

5. An arrangement according to claim 1 wherein the tensile members are flexible.

6. An arrangement according to claim 1 wherein at least one of the outer coils is retained within a journal, and the strap elements surround the journal and the coil therein.

7. An arrangement according to claim 1 wherein a slip plane material is placed between the radially inner surface of one of the outer coils and an adjacent surface of the associated strap element, and between the radially outer surface of the outer coil and the adjacent surface of the strap element.

8. An arrangement according to claim 1 wherein a filler material is positioned between the axially outer surface of one of the outer coils and the axially outer end of the associated strap element.

9. An arrangement according to claim 1 wherein one of the outer coils is impregnated with a hardened material, and the associated strap elements are bonded to the coil by the hardened material.

* * * * *